(12) United States Patent
Chou

(10) Patent No.: US 7,175,951 B1
(45) Date of Patent: Feb. 13, 2007

(54) TWO MASK IN-SITU OVERLAY CHECKING METHOD

(75) Inventor: Hong-Shing Chou, Taipei (TW)

(73) Assignee: Taiwan Semiconductor Manufacturing Company (TW)

( * ) Notice: Subject to any disclaimer, the term of this patent is extended or adjusted under 35 U.S.C. 154(b) by 506 days.

(21) Appl. No.: 10/126,388

(22) Filed: Apr. 19, 2002

(51) Int. Cl.
  *G03F 9/00* (2006.01)
  *G03C 5/00* (2006.01)

(52) U.S. Cl. .......................... 430/22; 430/30; 430/312; 382/151

(58) Field of Classification Search ................. 430/22, 430/30, 312; 382/151
  See application file for complete search history.

(56) References Cited

U.S. PATENT DOCUMENTS

| | | | |
|---|---|---|---|
| 5,498,500 A | 3/1996 | Bae | 430/22 |
| 5,635,336 A | 6/1997 | Bae | 430/314 |
| 5,770,338 A | 6/1998 | Lim et al. | 430/22 |
| 5,952,132 A * | 9/1999 | King et al. | 430/22 |
| 5,989,761 A * | 11/1999 | Kawakubo et al. | 430/22 |
| 6,330,355 B1 | 12/2001 | Chen et al. | 382/151 |
| 6,586,168 B1 * | 7/2003 | Ohsaki | 430/394 |

* cited by examiner

*Primary Examiner*—Christopher G. Young
(74) *Attorney, Agent, or Firm*—Duane Morris, LLP

(57) ABSTRACT

A method for in-situ overlay accuracy checking using a first mask having a first pattern and a second mask having a second pattern to expose a layer of photosensitive material formed on a wafer. The first pattern and the second pattern are exposed in the layer of photosensitive material using the first mask, the second mask, and a photolithographic alignment and exposure system. The layer of photosensitive material is then developed and the relative position between the first pattern and the second pattern is analyzed.

27 Claims, 6 Drawing Sheets

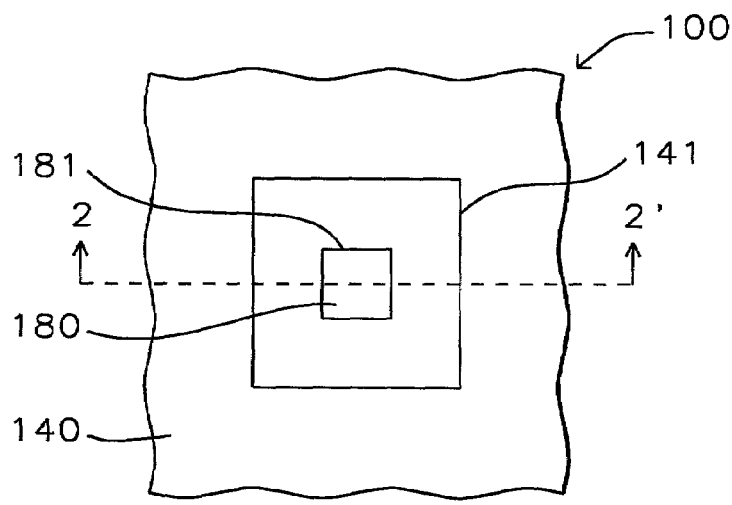
FIG. 1 – Prior Art
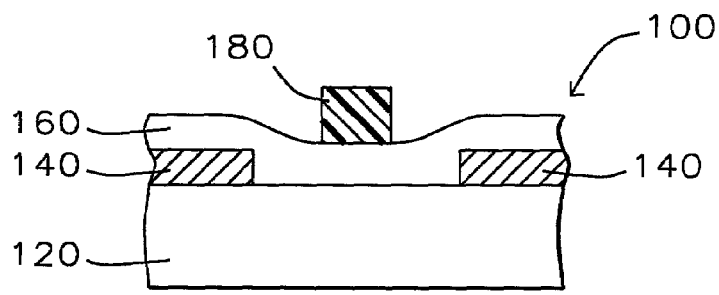
FIG. 2 – Prior Art
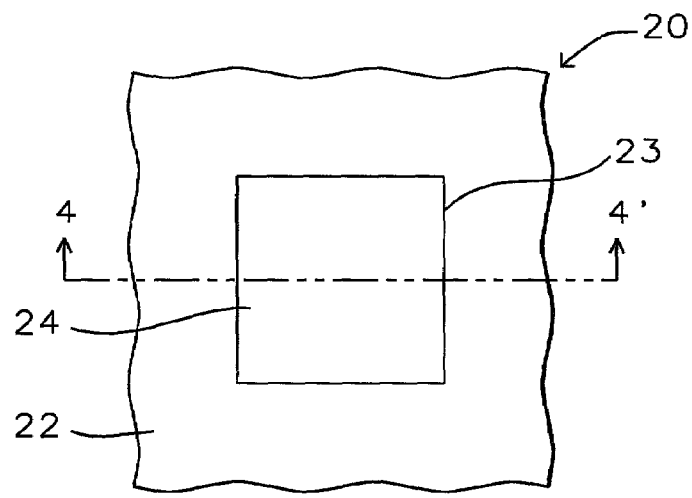
FIG. 3

TWO MASK IN-SITU OVERLAY CHECKING METHOD

BACKGROUND OF THE INVENTION (1) Field of the Invention

This invention relates to a method for in-situ checking of the overlay accuracy of two masks used in two levels of an integrated circuit wafer.

(2) Description of the Related Art

In photolithographic processing of integrated circuit wafers typically each layer is processed after exposing a pattern on that layer using a mask. It is, of course, of great importance that the alignment of each mask to the wafer, and thus to all other layers processed, is accurate. Often overlay patterns located on the different masks are used to measure the alignment accuracy between two layers. FIGS. 1 and 2 show a box in box pattern used to measure alignment between two layers. FIG. 1 shows the top view of a wafer 100 showing the box in box pattern formed on the wafer. FIG. 1 shows the outer box 140, with the inner perimeter 141 of the outer box 140 indicated by a dashed line, and the inner box 180, with the outer perimeter 181 of the inner box 180 indicated by a solid line.

FIG. 2 shows a cross section view of the wafer 100 shown in FIG. 1 taken along line 2–2' of FIG. 1. As shown in FIG. 2 the outer box 140 is formed by a patterned layer of metal formed on the substrate 120. A layer of material such as an insulator 160 is typically formed over the patterned layer of metal forming the outer box 140. The inner box 180 is formed by an exposed and developed layer of photoresist. The position of the inner box 180 relative to the outer box 140 can be measured to determine the alignment accuracy. This method will necessarily require two photoprocessing steps, with two photoresist application, exposure, and developing steps. One photoprocessing step is required to form the outer box 140 and one to form the inner box 180.

U.S. Pat. No. 5,498,500 to Bae describes an overlay measurement mark and method of measuring an overlay error between three patterns in a semiconductor device.

U.S. Pat. No. 5,635,336 to Bae describes the use of a box in box overlay pattern using a grove formed at the inner perimeter of the outer box to improve the measurement accuracy.

U.S. Pat. No. 5,770,338 to Lim et al. describes a phase shifting overlay mark that measures exposure energy and focus.

U.S. Pat. No. 6,330,355 to Chen et al. describes an overlay layout and method for determining the overlay accuracy of a first chip image relative to a second chip image when the first and second chip images are used to form a single layer on a single chip.

SUMMARY OF THE INVENTION

In conventional overlay accuracy measurement methods more than one photoprocessing steps, requiring more than one application of photoresist, is required. As an example again refer to the box in box pattern shown in FIGS. 1 and 2. As shown in FIG. 2, first the outer box 140 must be formed in the layer of metal which requires the formation of a patterned layer of resist material followed by an etching step to pattern the layer of metal and form the outer box 140. The formation of the inner box 180 requires patterning a second layer of resist material. While this method works well it is time consuming and does not allow for a quick determination of overlay accuracy to assure that the photolithographic exposure tools are performing accurately.

It is a principle objective of this invention to provide a method of in-situ overlay accuracy checking between a first mask and a second mask using a pattern formed in a single layer of photosensitive material.

It is another principle objective of this invention to provide a method of in-situ overlay accuracy checking between a first mask, a second mask, and a photolithographic alignment and exposure system using a pattern formed in a single layer of photosensitive material.

These objectives are achieved by first placing a wafer having a layer of photosensitive material, such as photoresist, formed thereon and a first mask having a first pattern in a photolithographic alignment and exposure system, such as a stepper. The layer of photosensitive material is then exposed with the first pattern. The first pattern has opaque regions, so that regions of the layer of photosensitive material remain unexposed after exposure using the first mask. The first mask is then removed from the photolithographic alignment and exposure system and a second mask having a second pattern is placed in the photolithographic alignment system without removing the wafer from the photolithographic alignment and exposure system. The layer of photosensitive material is then exposed with the second pattern. The second pattern has transparent regions located so that parts of those regions of the layer of photosensitive material left unexposed when the layer of photosensitive material was exposed using the first mask are exposed when the layer of photosensitive material is exposed using the second mask.

The layer of photosensitive material is then developed forming an overlay pattern, such as a box in box pattern or a vernier pattern, in the developed layer of photosensitive material. This overlay pattern in the developed layer of photosensitive material can then be measured to determine the overlay accuracy of the first mask and the second mask.

In a second embodiment the first mask and the wafer are placed in the photolithographic alignment and exposure system and the first pattern is exposed in the layer of photosensitive material. The first mask and the wafer are then removed. The second mask is then placed in the photolithographic alignment and exposure system, the wafer is replaced in the photolithographic alignment and exposure system, and the second pattern is exposed in the layer of photosensitive material. The layer of photosensitive material is then developed. In this case the alignment accuracy between the first mask, second mask, and photolithographic alignment and exposure system is measured.

BRIEF DESCRIPTION OF THE DRAWINGS

FIG. 1 shows a top view of a wafer having a box in box pattern.

FIG. 2 shows a cross section view of the wafer of FIG. 1 taken along line 2–2' of FIG. 1.

FIG. 3 shows a top view of a mask used to form the outer box in a box in box pattern.

DESCRIPTION OF THE PREFERRED EMBODIMENTS

Figure 4:
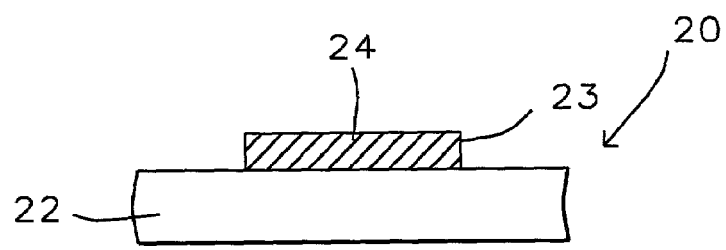
FIG. 4 shows a cross section view of the mask shown in FIG. 3 for forming the outer box in a box in box pattern, taken along line 4–4' of FIG. 3.

Refer now to FIGS. 3–17 for a description of the methods of checking mask overlay accuracy of this invention. FIGS. 3–6 show a box in box pattern used for determining overlay accuracy. FIG. 3 shows a top view of a part of a first mask 20 having the outer box of the box in box pattern. FIG. 4 is a cross section view of the part of the first mask 20 shown in FIG. 3 taken along line 4–4' of FIG. 3. FIG. 3 shows that the outer box has an inner perimeter 23. FIG. 4 shows that the region inside the inner perimeter 23 is opaque and that the first mask 20 is formed with opaque material 24 on a transparent mask substrate 22. The first mask 20 has a first region which is opaque, in this example the region within the inner perimeter 23.

Figure 5:
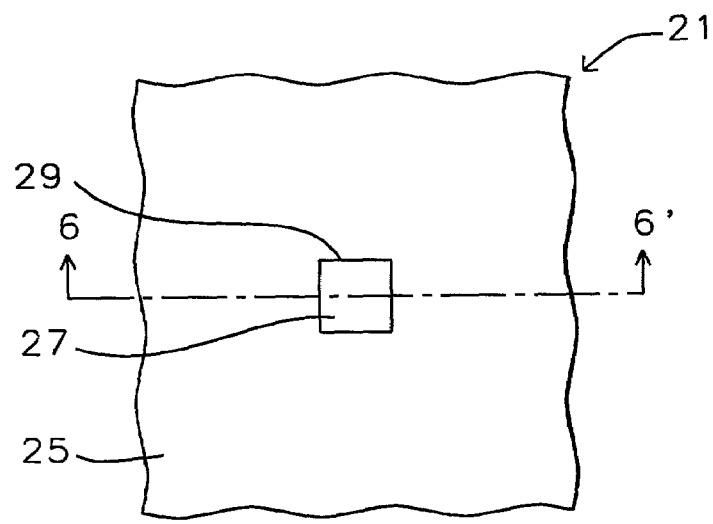
FIG. 5 shows a top view of a mask used to form the inner box in a box in box pattern.
Figure 6:
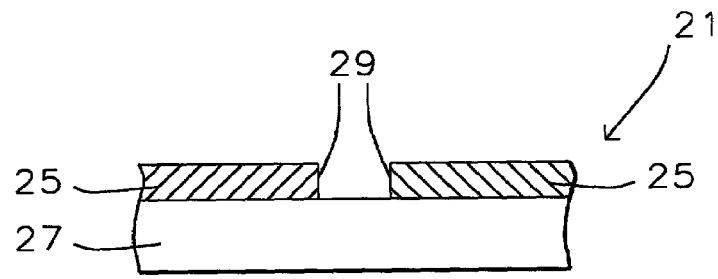
FIG. 6 shows a cross section view of the mask shown in FIG. 5 for forming the inner box in a box in box pattern, taken along line 6–6' of FIG. 5.

FIG. 5 shows a top view of a part of a second mask 21 having the inner box of the box in box pattern. FIG. 6 is a cross section view of the part of the second mask 21 shown in FIG. 5 taken along line 6–6' of FIG. 5. FIG. 5 shows that the inner box has an outer perimeter 29. FIG. 6 shows that the region inside the outer perimeter 29 is transparent and that the second mask 21 is formed with opaque material 25 on a transparent mask substrate 27. The second mask 21 has a second region which is transparent, in this example the region within the outer perimeter 29.

Figure 7:
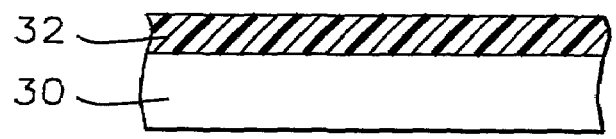
FIG. 7 shows a cross section of a substrate having a layer of resist material formed thereon.
Figure 16:
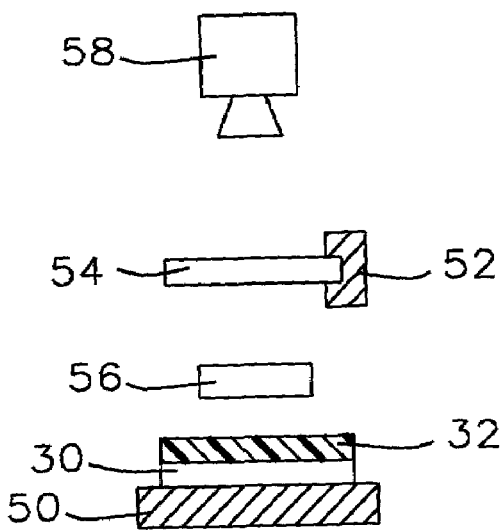
FIG. 16 shows a schematic view of a photolithographic exposure system.

FIG. 7 shows a cross section view of an integrated circuit wafer 30 having a layer of photosensitive material 32 formed thereon. FIG. 16 shows a schematic view of a photolithographic alignment and exposure system, such as a stepper. FIG. 16 shows a mask 54 held in place by a mask holder 52 and a wafer 30, having a layer of photosensitive material 32 formed thereon, held in place by a wafer holder 50. A light source 58 illuminates the mask and any patterns in the mask are focused on the wafer using an objective lens 56. Alignment between the mask and wafer is accomplished by means of moving the mask holder 52, the wafer holder 50, or both.

Refer to FIGS. 3–7 and 16 for a preferred embodiment of the method of this invention for determining the overlay accuracy of a first mask and a second mask, using the box in box pattern. A wafer 30 having a layer of photosensitive material 32, such as a positive or negative photoresist, is placed in the wafer holder 50 and the first mask 20 is placed in the mask holder 52 and aligned to the wafer 30. The layer of photosensitive material 32 is then exposed a first time. The first mask 20 is then removed from the mask holder 52 and the second mask 21 is placed in the mask holder 52 and aligned to the wafer 30 without removing the wafer 30 from the wafer holder 50. The layer of photosensitive material 32 is then exposed a second time. The layer of photosensitive material 32 is then developed to form the final overlay pattern. The final overlay pattern is then analyzed to determine the overlay accuracy of the first mask and the second mask.

Refer again to FIGS. 3–7 and 16 for another preferred embodiment of the method of this invention for determining the overlay accuracy of a first mask, a second mask, and a photolithographic alignment and exposure system or stepper, using the box in box pattern. The wafer 30 having a layer of photosensitive material 32, such as a positive or negative photoresist, formed thereon is placed in the wafer holder 50 and the first mask 20 is placed in the mask holder 52 and aligned to the wafer 30. The layer of photosensitive material 32 is then exposed a first time. The first mask 20 is then removed from the mask holder 52 and the wafer 30 is removed from the wafer holder 50. Next the wafer 30 having the layer of photosensitive material 32 is replaced in the wafer holder 50 and the second mask 21 is placed in the mask holder 52 and aligned to the wafer 30. The layer of photosensitive material 32 is then exposed a second time. The layer of photosensitive material 32 is then developed to form the final overlay pattern. The final overlay pattern is then analyzed to determine the overlay accuracy of the first mask, the second mask, and the photolithographic alignment and exposure system or stepper.

Figure 8:
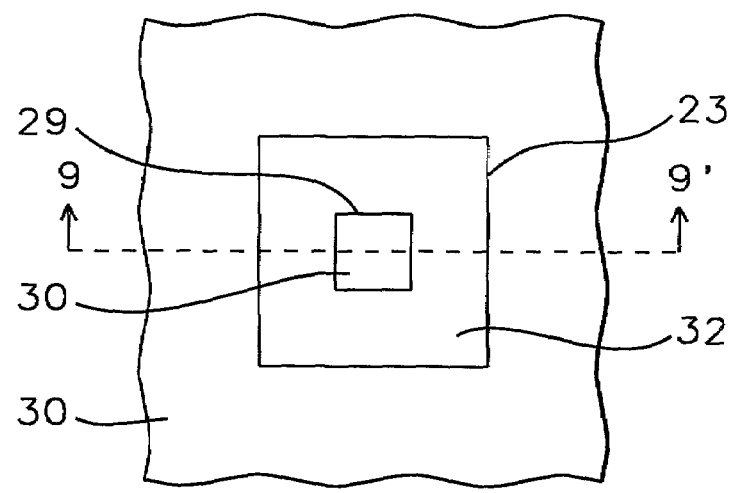
FIG. 8 shows a top view of the substrate having a box in box pattern formed in the layer of resist formed on the substrate.
Figure 9:
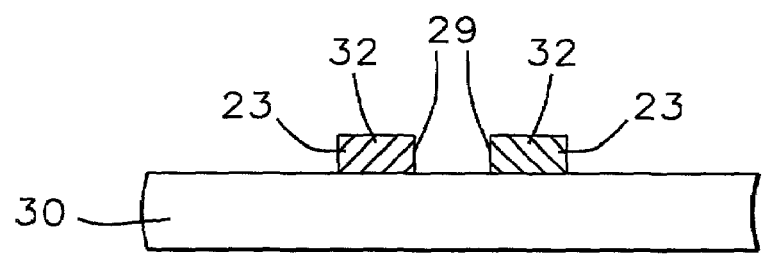
FIG. 9 shows a cross section view of the substrate having a box in box pattern formed in the layer of resist formed on the substrate, taken along line 9–9' of FIG. 9.

FIGS. 8 and 9 show the resulting final overlay pattern formed in the photosensitive material. FIG. 8 shows the top view of the final overlay pattern showing the inner perimeter 23 of the outer box and the outer perimeter 29 of the inner box in the box in box pattern. The developing has removed the photosensitive material from the region outside the inner perimeter 23 of the outer box and from the region inside the outer perimeter 29 of the inner box making the wafer 30 visible in these regions. The photosensitive dielectric material 32 remains in the region inside the inner perimeter 23 of the outer box and outside the outer perimeter 29 of the inner box. This provides the final overlay pattern, in this example a box in box pattern in a single layer of photosensitive material 32. In this example the photosensitive material is a positive photosensitive material. Those skilled in the art will readily recognize that the method will work equally well with a negative photosensitive material. With a negative photosensitive material the regions having photosensitive material remaining and removed will be reversed.

Figure 17:
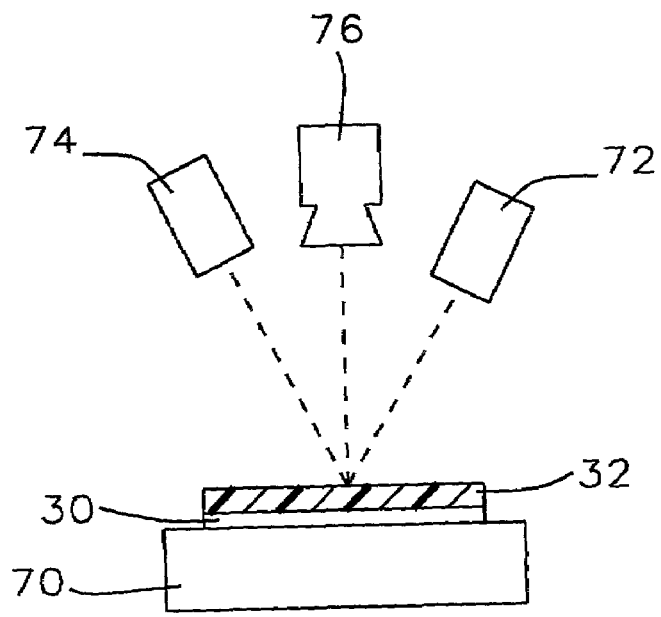
FIG. 17 shows a schematic diagram view of a system for either visual observation or automatic measurement of the overlay pattern formed in the layer of resist.

The final overlay pattern can be achieved in a single layer of photosensitive material because the first region of the first mask, in this example the region inside the inner perimeter 23 of the outer box shown in FIG. 3, is opaque and the second region of the second mask, in this example the region inside the outer perimeter 29 of the inner box shown in FIG. 5, is transparent. Since this first region of the first mask is opaque and the second region of the second mask is transparent the photosensitive material can be either positive or negative photoresist. The exposure of the photosensitive material using the first mask leaves a region of the layer of photosensitive material corresponding to the first region of the first mask unexposed. The exposure of the photosensitive material using the second region of the second mask exposes a part of this unexposed region to form the final overlay image. The box in box pattern can be measured using an automated system as shown in FIG. 17. A light source 76 illuminates the layer of photosensitive material 32 formed on a wafer 30, placed on a wafer holder 70, having the box in box pattern. An automatic measuring system 72 can measure the box in box pattern and determine the accuracy of the alignment of the first mask and the second mask used to expose the photosensitive material.

Figure 10:
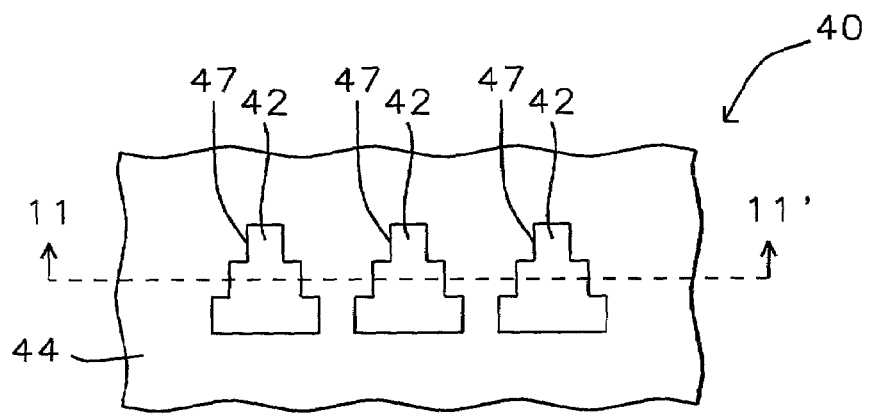
FIG. 10 shows a top view of a mask used to form the first part of a vernier pattern.
Figure 11:
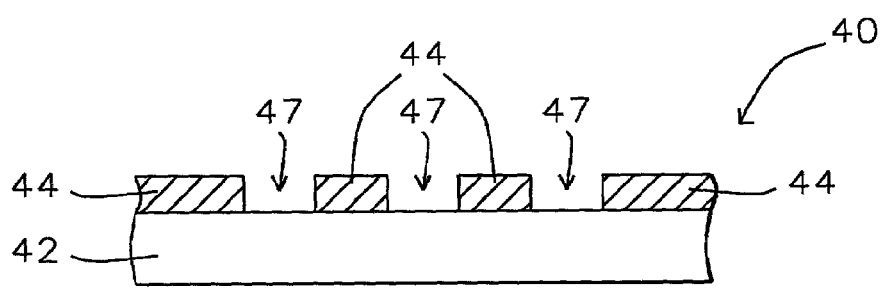
FIG. 11 shows a cross section view of the mask shown in FIG. 10 for forming the first part of a vernier pattern, taken along line 11–11' of FIG. 10.

FIGS. 10–13 show a vernier pattern which can be used in place of the box in box pattern of FIGS. 3–6 for determining overlay accuracy. FIG. 10 shows the top view and FIG. 11 the cross section view of the first mask 40 having a first vernier pattern. The mask is formed using patterned opaque material 44 on a transparent mask substrate 42. In this example the first vernier pattern comprises a number of first vernier marks 47, in this example three. The region outside of the first vernier marks 47 is the first region of the first mask and is opaque. The region inside the first vernier marks 47 is transparent.

Figure 12:
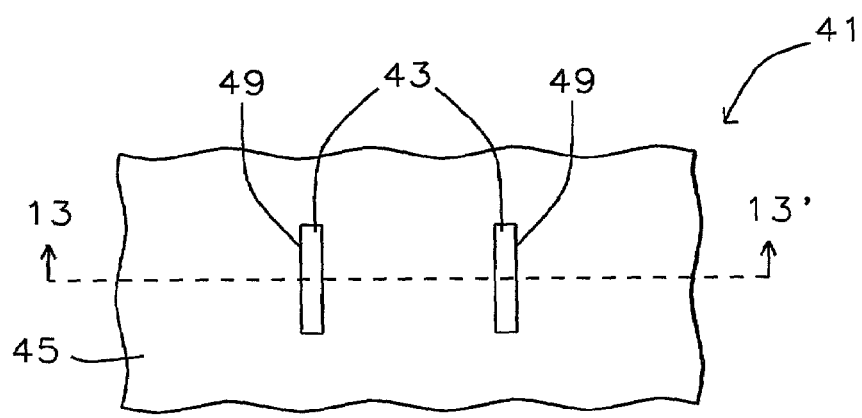
FIG. 12 shows a top view of a mask used to form the second part of a vernier pattern.
Figure 13:
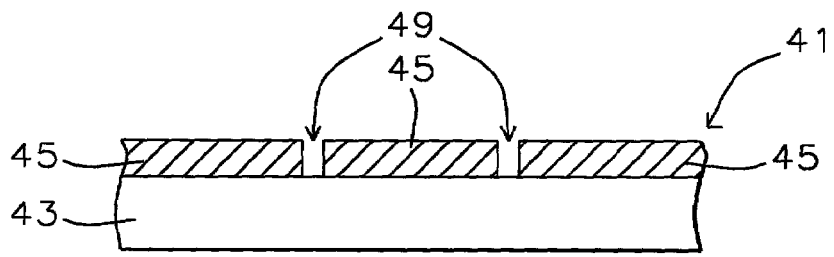
FIG. 13 shows a cross section view of the mask shown in FIG. 12 for forming the second part of a vernier pattern, taken along line 13–13' of FIG. 12.

FIG. 12 shows the top view and FIG. 13 the cross section view of the second mask 41 having a second vernier pattern. The mask is formed using patterned opaque material 45 on a transparent mask substrate 43. In this example the second vernier pattern comprises a number of second vernier marks 49, in this example two. The region inside of the second vernier marks is the second region of the second mask and is transparent. The region outside the second vernier marks is opaque.

Refer now to FIGS. 7, 10–13, and 16, for a preferred embodiment of the method of this invention for determining the overlay accuracy of a first mask and a second mask, using the vernier pattern. The wafer 30 having a layer of photosensitive material 32, such as a positive or negative photoresist, is placed in the wafer holder 50 and the first mask 40 is placed in the mask holder 52 and aligned to the wafer 30. The layer of photosensitive material 32 is then exposed a first time. The first mask 40 is then removed from the mask holder 52 and the second mask 41 is placed in the mask holder 52 and aligned to the wafer 30 without removing the wafer 30 from the wafer holder 50. The layer of photosensitive material 32 is then exposed a second time. The layer of photosensitive material 32 is then developed to form the final overlay pattern. The final overlay pattern is then analyzed to determine the overlay accuracy of the first mask and the second mask.

Refer again to FIGS. 7, 10–13, and 16 for another preferred embodiment of the method of this invention for determining the overlay accuracy of a first mask, a second mask, and a photolithographic alignment and exposure system or stepper, using a vernier pattern. The wafer 30 having a layer of photosensitive material 32, such as a positive or negative photoresist, is placed in the wafer holder 50 and the first mask 40 is placed in the mask holder 52 and aligned to the layer of photosensitive material 32 formed on the wafer 30. The layer of photosensitive material 32 is then exposed a first time. The first mask 40 is then removed from the mask holder 52 and the wafer 30 is removed from the wafer holder 50. Next the wafer 30 having the layer of photosensitive material 32 is replaced in the wafer holder 50 and the second mask 41 is placed in the mask holder 52 and aligned to the wafer 30. The layer of photosensitive material 32 is then exposed a second time. The layer of photosensitive material 32 is then developed to form the final overlay pattern. The final overlay pattern is then analyzed to determine the overlay accuracy of the first mask, the second mask, and the photolithographic alignment and exposure system or stepper.

Figure 14:
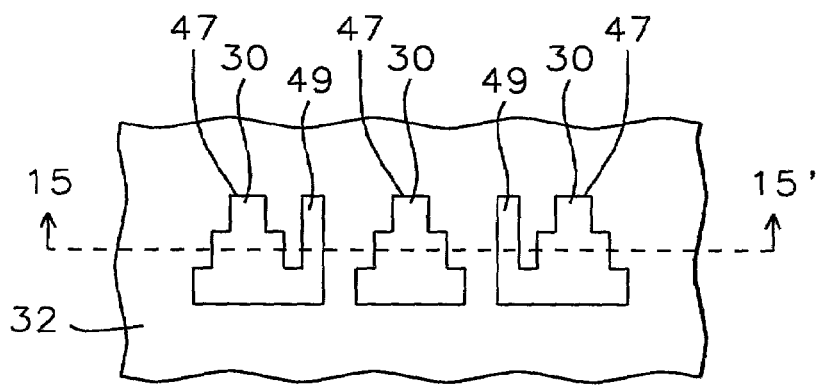
FIG. 14 shows a top view of the substrate having a vernier pattern formed in the layer of resist formed on the substrate.
Figure 15:
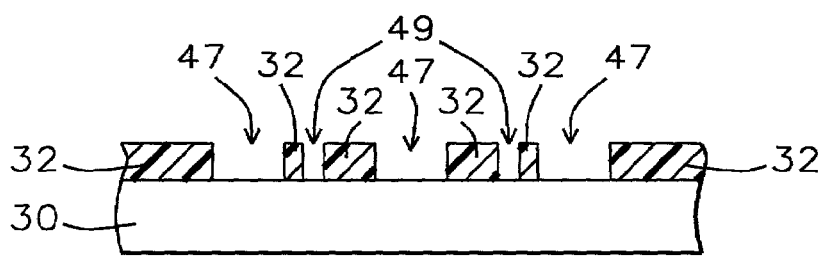
FIG. 15 shows a cross section view of the substrate having a vernier pattern formed in the layer of resist formed on the substrate, taken along line 15–15' of FIG. 14.

FIGS. 14 and 15 show the resulting final overlay pattern formed in the photosensitive material. FIG. 14 shows the top view of the final overlay pattern showing the first vernier marks 47 and the second vernier marks 49 in the vernier pattern. The developing has removed the photosensitive material from the region inside the first vernier marks 47 and inside the second vernier marks 49 making the wafer 30 visible in these regions. The photosensitive material 32 remains in the region outside the first vernier marks 47 and outside the second vernier marks 49. This provides the final overlay pattern, in this example a vernier pattern in a single layer of photosensitive material 32. In this example the photosensitive material is a positive photosensitive material. Those skilled in the art will readily recognize that the method will work equally well with a negative photosensitive material. With a negative photosensitive material the regions having photosensitive material remaining and removed will be reversed.

The final overlay pattern can be achieved in a single layer of photosensitive material because the first region of the first mask, in this example the region outside the first vernier marks 47 shown in FIG. 10, is opaque and the second region of the second mask, in this example the region inside the second vernier marks 49 FIG. 12, is transparent. Since this first region of the first mask is opaque and the second region of the second mask is transparent the photosensitive material can be either positive or negative photoresist. The exposure of the photosensitive material using the first mask leaves a region of the layer of photosensitive material corresponding to the first region of the first mask unexposed. The exposure of the photosensitive material using the second region of the second mask exposes a part of this unexposed region to form the final overlay image. The vernier pattern can be measured using a visual observation system as shown in FIG. 17. A light source 76 illuminates a layer of photosensitive material 32 formed on a wafer 30, placed on a wafer holder 70, having the vernier pattern. A visual observation system 74 can measure the vernier pattern and determine the accuracy of the alignment of the first mask and the second mask used to expose the photosensitive material.

While the invention has been particularly shown and described with reference to the preferred embodiments thereof, it will be understood by those skilled in the art that various changes in form and details may be made without departing from the spirit and scope of the invention.

What is claimed is:

1. A method of checking mask overlay accuracy, comprising:

providing a stepper, wherein said stepper is a photolithographic alignment and exposure system;

providing a first mask having a first overlay pattern;

providing a second mask having a second overlay pattern;

providing a wafer having a layer of photosensitive material formed thereon;

placing said first mask and said wafer in said stepper;

aligning said first mask to said wafer and exposing said first pattern in said layer of photosensitive material using said stepper, after placing said first mask and said wafer in said stepper;

removing said first mask from said stepper and placing said second mask in said stepper without removing said wafer from said stepper, after exposing said first pattern in said layer of photosensitive material;

aligning said second mask to said wafer and exposing said second pattern in said layer of photosensitive material using said stepper, after placing said second mask in said stepper;

developing said layer of photosensitive material, after exposing said first pattern and said second pattern in said layer of photosensitive material, thereby forming said first pattern and said second pattern in said developed layer of photosensitive material; and analyzing said first pattern and said second pattern formed in said developed layer of photosensitive material, thereby determining the alignment accuracy between said first mask, said second mask, and said wafer.

2. The method of claim 1 wherein said photosensitive material is positive photoresist.

3. The method of claim 1 wherein said photosensitive material is negative photoresist.

4. The method of claim 1 wherein said exposing said first pattern in said layer of photosensitive material leaves a first region of said photosensitive material unexposed, and said exposing said second pattern in said layer of photosensitive material exposes a part of said first region.

5. The method of claim 1 wherein said first pattern and said second pattern formed in said developed layer of photosensitive material comprises a box in box pattern.

6. The method of claim 1 wherein said first pattern and said second pattern formed in said developed layer of photosensitive material comprises a vernier pattern.

7. The method of claim 1 wherein said analyzing said first pattern and said second pattern formed in said developed layer of photosensitive material is accomplished by means of automatic measurement of the position of said first pattern formed in said developed layer of photosensitive material relative to the position of said second pattern formed in said developed layer of photosensitive material.

8. The method of claim 1 wherein said analyzing said first pattern and said second pattern formed in said developed layer of photosensitive material is accomplished by means of visual observation of the position of said first pattern formed in said developed layer of photosensitive material relative to the position of said second pattern formed in said developed layer of photosensitive material.

9. The method of claim 1 wherein said first pattern comprises an outer box having an inner perimeter and said second pattern comprises an inner box having an outer perimeter, the region of said first mask within said inner perimeter is opaque, the region of said first mask outside said inner perimeter is transparent, the region of said second mask within said outer perimeter is transparent, the region of said second mask outside said outer perimeter is opaque, and said inner box is smaller than said outer box.

10. The method of claim 1 wherein said first pattern comprises three vernier regions and said second pattern comprises two rectangles, that part of said first mask within said three vernier regions is transparent, that part of said first mask outside said three vernier regions is opaque, that part of said second mask within said two rectangles is transparent, and that part of said first mask outside said two rectangles is opaque.

11. A method of checking mask overlay accuracy, comprising:
providing a stepper, wherein said stepper is a photolithographic alignment and exposure system;
providing a first mask having a first overlay pattern;
providing a second mask having a second overlay pattern;
providing a wafer having a layer of photosensitive material formed thereon;

placing said first mask and said wafer in said stepper;

aligning said first mask to said wafer and exposing said first pattern in said layer of photosensitive material using said stepper, after placing said first mask and said wafer in said stepper;

removing said first mask and said wafer from said stepper after exposing said first pattern in said layer of photosensitive material;

placing said second mask and said wafer in said stepper after removing first mask and said wafer from said stepper;

aligning said second mask to said wafer and exposing said second pattern in said layer of photosensitive material using said stepper, after placing said second mask and said wafer in said stepper;

developing said layer of photosensitive material, after exposing said first pattern and said second pattern in said layer of photosensitive material, thereby forming said first pattern and said second pattern in said developed layer of photosensitive material; and analyzing said first pattern and said second pattern formed in said developed layer of photosensitive material, thereby determining the alignment accuracy between said first mask, said second mask, said photolithographic alignment system, and said wafer.

12. The method of claim 11 wherein said photosensitive material is positive photoresist.

13. The method of claim 11 wherein said photosensitive material is negative photoresist.

14. The method of claim 11 wherein said exposing said first pattern in said layer of photosensitive material leaves a first region of said photosensitive material unexposed, and said exposing said second pattern in said layer of photosensitive material exposes a part of said first region.

15. The method of claim 11 wherein said fist pattern and said second pattern formed in said developed layer of photosensitive material comprises a box in box pattern.

16. The method of claim 11 wherein said first pattern and said second pattern formed in said developed layer of photosensitive material comprises a vernier pattern.

17. The method of claim 11 wherein said analyzing said first pattern and said second pattern formed in said developed layer of photosensitive material is accomplished by means of automatic measurement of the position of said first pattern formed in said developed layer of photosensitive material relative to the position of said second pattern formed in said developed layer of photosensitive material.

18. The method of claim 11 wherein said analyzing said first pattern and said second pattern formed in said developed layer of photosensitive material is accomplished by means of visual observation of the position of said first pattern formed in said developed layer of photosensitive material relative to the position of said second pattern formed in said developed layer of photosensitive material.

19. The method of claim 11 wherein said first pattern comprises an outer box having an inner perimeter and said second pattern comprises an inner box having an outer perimeter, the region of said first mask within said inner perimeter is opaque, the region of said first mask outside said inner perimeter is transparent, the region of said second mask within said outer perimeter is transparent, the region of said second mask outside said outer perimeter is opaque, and said inner box is smaller than said outer box.

20. The method of claim 11 wherein said first pattern comprises three vernier regions and said second pattern comprises two rectangles, that part of said first mask within said three vernier regions is transparent, that part of said first mask outside said three vernier regions is opaque, that part of said second mask within said two rectangles is transparent, and that part of said first mask outside said two rectangles is opaque.

21. A method of checking mask overlay accuracy, comprising:
   providing a photolithographic alignment and exposure system;
   forming a photosensitive layer,
   forming a first set of patterns in said photosensitive layer using a first mask and said photolithographic alignment and exposure system;
   forming a second set of patterns in said photosensitive layer using a second mask and said photolithographic alignment and exposure system; and
   comparing the relative positions between said first set of patterns and said second set of patterns.

22. The method of claim 21 wherein said photosensitive layer comprises positive photoresist.

23. The method of claim 21 wherein said photosensitive layer comprises negative photoresist.

24. The method of claim 21 wherein said first set of patterns and said second set of patterns comprise a box in box pattern.

25. The method of claim 21 wherein said first set of patterns and said second set of patterns comprise a vernier pattern.

26. The method of claim 21 wherein said comparing the relative position between said first set of patterns and said second set of patterns is accomplished by means of automatic measurement of the position of said first set of patterns and the position of said second set of patterns.

27. The method of claim 21 wherein said comparing the relative position between said first set of patterns and said second set of patterns is accomplished by means of visual observation of said first set of patterns and said second set of patterns.

* * * * *

UNITED STATES PATENT AND TRADEMARK OFFICE
CERTIFICATE OF CORRECTION

PATENT NO. : 7,175,951 B1 Page 1 of 1
APPLICATION NO. : 10/126388
DATED : February 13, 2007
INVENTOR(S) : Hong-Shing Chou It is certified that error appears in the above-identified patent and that said Letters Patent is hereby corrected as shown below:

Column 8, line 35, delete "fist" and insert therefore -- first --.

Signed and Sealed this

Thirty-first Day of July, 2007

JON W. DUDAS
*Director of the United States Patent and Trademark Office*